(12) United States Patent
Huang et al.

(10) Patent No.: US 12,177,964 B2
(45) Date of Patent: Dec. 24, 2024

(54) CIRCUIT BOARD AND MANUFACTURING METHOD THEREOF AND ELECTRONIC DEVICE

(71) Applicant: Unimicron Technology Corp., Taoyuan (TW)

(72) Inventors: Jun-Rui Huang, Tainan (TW);
Chih-Chiang Lu, New Taipei (TW);
Yi-Pin Lin, Taoyuan (TW);
Ching-Sheng Chen, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 300 days.

(21) Appl. No.: 17/711,027

(22) Filed: Apr. 1, 2022

(65) Prior Publication Data

US 2022/0232695 A1 Jul. 21, 2022

Related U.S. Application Data

(63) Continuation-in-part of application No. 17/498,757, filed on Oct. 12, 2021, now Pat. No. 12,057,381.
(Continued)

(30) Foreign Application Priority Data

Sep. 14, 2021 (TW) .................. 110134179

(51) Int. Cl.
*H05K 1/02* (2006.01)
*H01L 23/498* (2006.01)
(Continued)

(52) U.S. Cl.
CPC ......... *H05K 1/0231* (2013.01); *H05K 1/0298* (2013.01); *H05K 1/116* (2013.01);
(Continued)

(58) Field of Classification Search
CPC ...... H05K 1/0222; H05K 1/113; H05K 1/119; H05K 3/429; H05K 3/0094; H05K 1/0221;
(Continued)

(56) References Cited

U.S. PATENT DOCUMENTS

| 7,767,913 | B2 | 8/2010 | Corisis et al. |
| 8,354,601 | B2 | 1/2013 | Russell |

(Continued)

FOREIGN PATENT DOCUMENTS

| CN | 1170465 | 10/2004 |
| CN | 101313439 | 11/2011 |
| TW | 201220967 | 5/2012 |

OTHER PUBLICATIONS

"Office Action of Taiwan Counterpart Application", issued on May 19, 2023, p. 1-p. 12.

*Primary Examiner* — Hoa C Nguyen
*Assistant Examiner* — Amol H Patel
(74) *Attorney, Agent, or Firm* — JCIPRNET

(57) ABSTRACT

A circuit board includes a first substrate, a second substrate, a third substrate, a plurality of conductive structures and a conductive via structure. The second substrate is disposed between the first substrate and the third substrate. The third substrate has an opening and includes a first dielectric layer, a second dielectric layer, and a third dielectric layer. The opening penetrates the first dielectric layer and the second dielectric layer, and the third dielectric layer fully fills the opening. The conductive via structure penetrates the first substrate, the second substrate, the third dielectric layer of the third substrate, and is electrically connected to the first substrate and the third substrate to define a signal path. The first substrate, the second substrate, and the third substrate are electrically connected through the conductive structures (Continued)

to define a ground path, and the ground path surrounds the signal path.

5 Claims, 13 Drawing Sheets

Related U.S. Application Data

(60) Provisional application No. 63/235,105, filed on Aug. 19, 2021, provisional application No. 63/139,795, filed on Jan. 21, 2021.

(51) Int. Cl.
*H05K 1/11* (2006.01)
*H05K 3/00* (2006.01)
*H05K 3/42* (2006.01)

(52) U.S. Cl.
CPC .......... *H05K 3/0094* (2013.01); *H05K 3/421* (2013.01); *H05K 3/429* (2013.01); *H05K 2201/0195* (2013.01); *H05K 2201/0723* (2013.01); *H05K 2201/09509* (2013.01); *H05K 2201/0959* (2013.01); *H05K 2201/09645* (2013.01); *H05K 2203/0502* (2013.01); *H05K 2203/1461* (2013.01)

(58) Field of Classification Search
CPC ......... H05K 1/115; H05K 2201/09618; H05K 1/0251; H05K 1/0219
See application file for complete search history.

(56) References Cited

U.S. PATENT DOCUMENTS

| | | | |
|---|---|---|---|
| 8,502,085 | B2 | 8/2013 | Kim |
| 8,541,694 | B2 | 9/2013 | Nomiya |
| 9,635,761 | B2 | 4/2017 | Brigham et al. |
| 10,375,838 | B2 | 8/2019 | Brigham et al. |
| 2011/0203842 | A1* | 8/2011 | Russell ................ H05K 1/0222 29/829 |
| 2013/0098669 | A1* | 4/2013 | Yoshimura ............. H05K 3/427 174/258 |

* cited by examiner

CIRCUIT BOARD AND MANUFACTURING METHOD THEREOF AND ELECTRONIC DEVICE

CROSS-REFERENCE TO RELATED APPLICATION

This application is a continuation-in-part application of and claims the priority benefit of U.S. application Ser. No. 17/498,757, filed on Oct. 12, 2021, now pending. The prior U.S. application Ser. No. 17/498,757 claims the priority benefits of U.S. provisional application Ser. No. 63/139,795, filed on Jan. 21, 2021, U.S. provisional application Ser. No. 63/235,105, filed on Aug. 19, 2021, and Taiwan application serial no. 110134179, filed on Sep. 14, 2021. The entirety of each of the above-mentioned patent applications is hereby incorporated by reference herein and made a part of this specification.

BACKGROUND

Technical Field

The disclosure relates to a substrate structure and a manufacturing method thereof, and in particular, to a circuit board and a manufacturing method thereof and an electronic device adopting the circuit board.

Description of Related Art

In a conventional circuit board, a design of a coaxial via requires one or more layers of insulating layers between an inner conductor layer and an outer conductor layer for isolation. The insulating layers are formed through press-fitting and a build-up process. Therefore, there may be impedance mismatch and a gap of electromagnetic interference (EMI) shielding at the two ends of the coaxial via, affecting high-frequency signal integrity. In addition, in the design of the coaxial via, the two ends of a signal path and the two ends of a ground path are respectively located on different planes, and noise interference cannot be reduced.

SUMMARY

The disclosure is directed to a circuit board having a good signal circuit and exhibiting favorable signal integrity.

The disclosure further provides a manufacturing method of a circuit board to manufacture the circuit board.

The disclosure further provides an electronic device including the circuit board and exhibiting favorable electromagnetic interference (EMI) shielding and impedance matching effects, thereby enhancing reliability of signal transmission.

The circuit board of the disclosure includes a first substrate, a second substrate, a third substrate, multiple conductive structures, and a conductive via structure. The second substrate is disposed between the first substrate and the third substrate. The third substrate has an opening and includes a first dielectric layer, a second dielectric layer, and a third dielectric layer. The opening penetrates the first dielectric layer and the second dielectric layer, and the opening is fully filled with the third dielectric layer. The conductive via structure penetrates the first substrate, the second substrate, and the third dielectric layer of the third substrate and is electrically connected to the first substrate and the third substrate to define a signal path. The first substrate, the second substrate, and the third substrate are electrically connected through the conductive structures to define a ground path. The ground path surrounds the signal path.

In an embodiment of the disclosure, the conductive structures include multiple first conductive vias, multiple conductive pillars, and a conductive connection layer. The first substrate includes a core layer, a first external circuit layer, a first circuit layer, and first conductive vias. The first external circuit layer and the first circuit layer are respectively disposed on two opposite sides of the core layer. The first conductive vias penetrate the core layer and are electrically connected to the first external circuit layer and the first circuit layer. The second substrate includes a base and the conductive pillars penetrating the base. The third substrate further includes a second circuit layer, a third circuit layer, a second external circuit layer, multiple second conductive vias, and the conductive connection layer. The second circuit layer and the third circuit layer are located at two opposite sides of the first dielectric layer, and the second dielectric layer covers the third circuit layer and located between the third circuit layer and the second external circuit layer. The second conductive vias penetrate the second dielectric layer and are electrically connected to the second external circuit layer and the third circuit layer. The conductive connection layer covers an inner wall of the opening and is connected to the second circuit layer, the third circuit layer, and the second external circuit layer. The conductive via structure includes a via and a conductive material. The via penetrates the core layer of the first substrate, the base of the second substrate, and the third dielectric layer of the third substrate. The conductive material covers an inner wall of the via and is electrically connected to the first external circuit layer and the second external circuit layer.

In an embodiment of the disclosure, the first external circuit layer includes a first signal circuit and a first ground circuit. The second external circuit layer includes a second signal circuit and a second ground circuit. The first signal circuit, the conductive material, and the second signal circuit define the signal path. The first ground circuit, the first conductive vias, the first circuit layer, the conductive pillars, the second circuit layer, the conductive connection layer, and the second ground circuit define the ground path.

In an embodiment of the disclosure, the circuit board further includes a fourth dielectric layer fully filling the via. A first surface and a second surface of the fourth dielectric layer that are opposite to each other are respectively flush with an upper surface of the first external circuit layer and a lower surface of the second external circuit layer.

In an embodiment of the disclosure, the circuit board further includes a capping layer disposed on the upper surface of the first external circuit layer, the lower surface of the second external circuit layer, and the first surface and the second surface of the fourth dielectric layer.

The manufacturing method of the circuit board of the disclosure includes the following. A first substrate, a second substrate, and a third substrate are provided. The third substrate has an opening and includes a first dielectric layer, a second dielectric layer, and a third dielectric layer. The opening penetrates the first dielectric layer and the second dielectric layer, and the opening is fully filled with the third dielectric layer. The first substrate, the second substrate, and the third substrate are press-fitted so that the second substrate is located between the first substrate and the third substrate. Multiple conductive structures are formed so that the first substrate, the second substrate, and the third substrate are electrically connected through the conductive structures to define a ground path. A conductive via structure is formed to penetrate the first substrate, the second substrate, and the third dielectric layer of the third substrate. The conductive via structure is electrically connected to the first substrate and the third substrate to define a signal path. The ground path surrounds the signal path.

In an embodiment of the disclosure, providing the first substrate, the second substrate, and the third substrate includes the following. The first substrate is provided. The first substrate includes a core layer, a first conductive layer, and a first circuit layer. The first conductive layer and the first circuit layer are respectively disposed on two opposite sides of the core layer. The second substrate is provided. The second substrate includes a base and multiple conductive pillars penetrating the base. The third substrate is provided. The third substrate further includes a second circuit layer, a third circuit layer, a second conductive layer, and a conductive connection layer. The second circuit layer and the third circuit layer are located at two opposite sides of the first dielectric layer. The second dielectric layer covers the third circuit layer and is located between the third circuit layer and the second conductive layer. The conductive connection layer covers an inner wall of the opening and is connected to the second circuit layer, the third circuit layer, and the second conductive layer.

In an embodiment of the disclosure, the conductive structures include multiple first conductive vias, the conductive pillars, and the conductive connection layer.

In an embodiment of the disclosure, forming the first conductive vias of the conductive structures and forming the conductive via structure include the following. Multiple first blind vias, multiple second blind vias, and a via are formed. The first blind vias extend from the first conductive layer to the first circuit layer, and the second blind vias extend from the second conductive layer to the third circuit layer. The via penetrates the core layer of the first substrate, the base of the second substrate, and the third dielectric layer of the third substrate. A conductive material layer is formed to fully fill the first blind vias and the second blind vias and extend to cover the first conductive layer, the second conductive layer, and an inner wall of the via. The conductive material layer fully filling the first blind vias defines the first conductive vias. The conductive material layer fully filling the second blind vias defines multiple second conductive vias. The conductive material layer, the first conductive layer, and the second conductive layer are patterned to form a first external circuit layer, a second external circuit layer, and a conductive material covering the inner wall of the via and electrically connected to the first external circuit layer and the second external circuit layer. The first external circuit layer is located on the core layer of the first substrate. The second external circuit layer is located on the second dielectric layer of the third substrate. The via and the conductive material define the conductive via structure.

In an embodiment of the disclosure, the first external circuit layer includes a first signal circuit and a first ground circuit. The second external circuit layer includes a second signal circuit and a second ground circuit. The first signal circuit, the conductive material, and the second signal circuit define the signal path. The first ground circuit, the first conductive vias, the first circuit layer, the conductive pillars, the second circuit layer, the conductive connection layer, and the second ground circuit define the ground path.

In an embodiment of the disclosure, the manufacturing method of the circuit board further includes the following. After the conductive material layer is formed and before the conductive material layer, the first conductive layer, and the second conductive layer are patterned, a fourth dielectric layer is filled in the via. The via is fully filled with the fourth dielectric layer, and a first surface and a second surface of the fourth dielectric layer that are opposite to each other are respectively flush with an upper surface and a lower surface of the conductive material layer.

In an embodiment of the disclosure, the manufacturing method of the circuit board further includes the following. After the fourth dielectric layer is filled in the via and before the conductive material layer, the first conductive layer, and the second conductive layer are patterned, a metal layer is formed on the conductive material layer. The metal layer covers the upper surface and the lower surface of the conductive material layer and the first surface and the second surface of the fourth dielectric layer. When the conductive material layer, the first conductive layer, and the second conductive layer are patterned, the metal layer is patterned at the same time to form a capping layer. The capping layer covers the first external circuit layer, the second external circuit layer, and the first surface and the second surface of the fourth dielectric layer.

The electronic device of the disclosure includes a circuit board and an electronic element. The circuit board includes a first substrate, a second substrate, a third substrate, multiple conductive structures, and a conductive via structure. The second substrate is disposed between the first substrate and the third substrate. The third substrate has an opening and includes a first dielectric layer, a second dielectric layer, and a third dielectric layer. The opening penetrates the first dielectric layer and the second dielectric layer, and the opening is fully filled with the third dielectric layer. The conductive via structure penetrates the first substrate, the second substrate, and the third dielectric layer of the third substrate and is electrically connected to the first substrate and the third substrate to define a signal path. The first substrate, the second substrate, and the third substrate are electrically connected through the conductive structures to define a ground path. The ground path surrounds the signal path. The electronic element is electrically connected to the circuit board.

In an embodiment of the disclosure, the electronic device further includes multiple connection members disposed between the third substrate of the circuit board and the electronic element. The electronic element is electrically connected to the circuit board through the connection members.

Based on the above, in the design of the circuit board of the disclosure, the conductive via structure penetrates the first substrate, the second substrate, and the third dielectric layer of the third substrate and is electrically connected to the first substrate and the third substrate to define the signal path. The first substrate, the second substrate, and the third substrate are electrically connected through the conductive structures to define the ground path. The ground path surrounds the signal path. Hence, the favorable high-frequency and high speed signal circuit may be formed, and in further application of integrated circuits and antennas, signal interference on the same plane may be eliminated. Signal energy loss and noise interference may be reduced to enhance the reliability of signal transmission.

In order to make the aforementioned features and advantages of the disclosure comprehensible, embodiments accompanied with drawings are described in detail below.

DESCRIPTION OF THE EMBODIMENTS

Figure 1A:
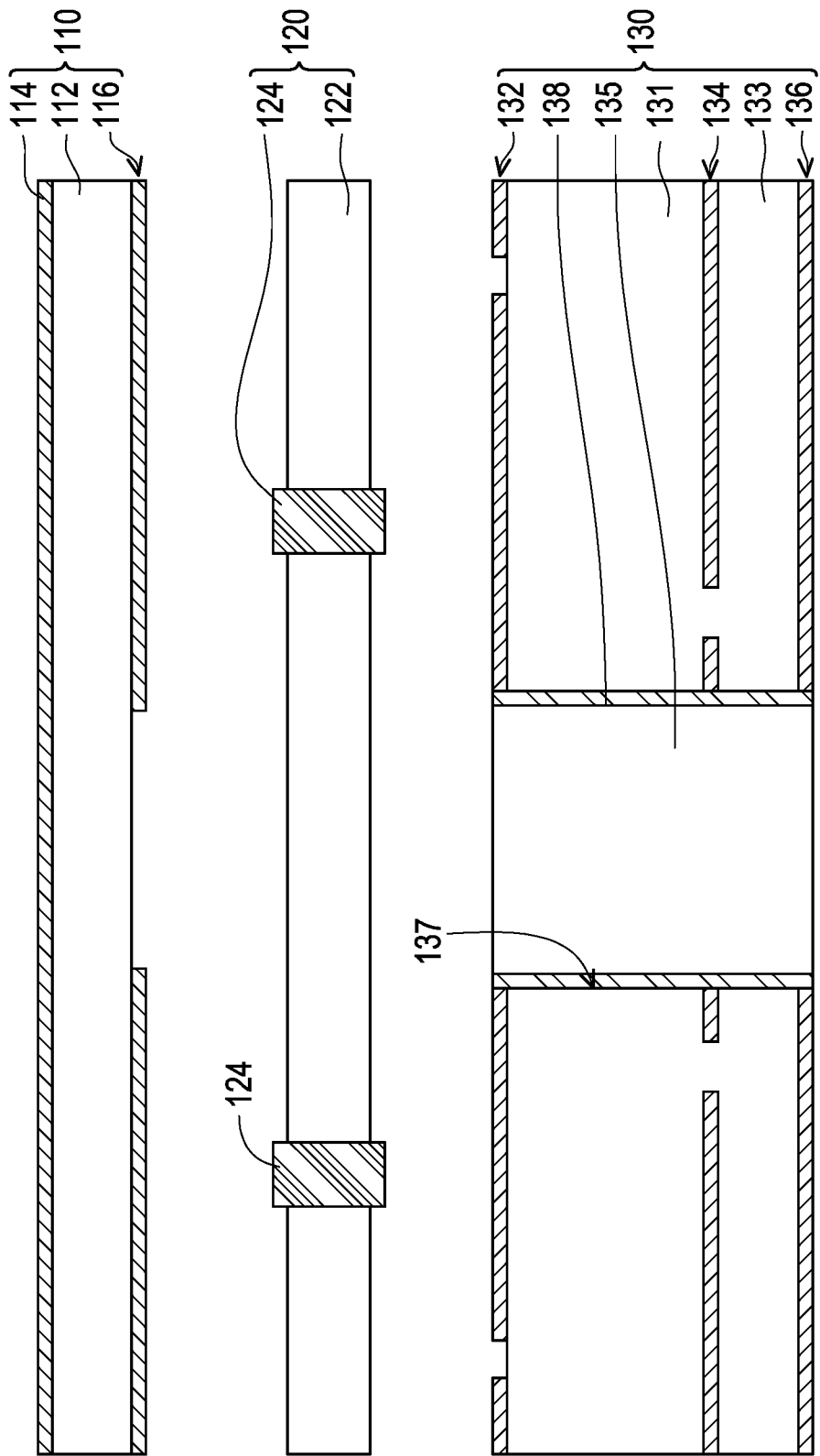
FIG. 1A to FIG. 1E are schematic cross-sectional diagrams of a manufacturing method of a circuit board according to an embodiment of the disclosure.

FIG. 1A to FIG. 1E are schematic cross-sectional diagrams of a manufacturing method of a circuit board according to an embodiment of the disclosure. FIG. 1F is a top-view of a circuit board of FIG. 1E. In the manufacturing method of the circuit board according to the embodiment, referring to FIG. 1A, a first substrate 110, a second substrate 120, a third substrate 130 are provided.

Specifically, in the embodiment, the first substrate 110 includes a core layer 112, a first conductive layer 114, and a first circuit layer 116. The first conductive layer 114 and the first circuit layer 116 are respectively disposed on two opposite sides of the core layer 112. The first conductive layer 114 is not patterned and completely covers a side surface of the core layer 112, and the first circuit layer 116 is exposed out of a portion of another side surface of the core layer 112. Here, a material of the core layer 112 is, for example, a dielectric material. A dielectric constant (Dk) of the core layer 112, for example, ranges from 2 to 3.5, and a dielectric dissipation factor (DO of the core layer 112 is, for example, less than 0.006. A material of the first conductive layer 114 and the first circuit layer 116 is, for example, copper; however, the disclosure is not limited thereto.

The second substrate 120 includes a base 122 and multiple conductive pillars 124 penetrating the base 122. Providing the second substrate 120 includes the following. First, the base 122 is provided. The base 122 is currently in a B phase state. That is, the base 122 is not completely cured. Next, release films may be attached to two opposite sides of the base 122. A material of the release films is, for example, polyethylene terephthalate (PET). Next, a drilling process is performed on the base 122 to form a via. The drilling process is, for example but not limited to, laser drilling or mechanical drilling. The via is filled with a conductive adhesive through printing or injection to form the conductive pillars 124. Next, the release films attached to the two opposite sides of the base 122 are removed so that two opposite surfaces of the conductive pillars 124 respectively protrude out of the two opposite sides of the base 122, and the manufacture of the second substrate 120 is completed.

The third substrate 130 includes an opening 137 and includes a first dielectric layer 131, a second dielectric layer 133, a third dielectric layer 135, a second circuit layer 132, a third circuit layer 134, a second conductive layer 136, and a conductive connection layer 138. The second circuit layer 132 and the third circuit layer 134 of the third substrate 130 are located at two opposite sides of the first dielectric layer 131. The second dielectric layer 133 covers the third circuit layer 134 and is located between the third circuit layer 134 and the second conductive layer 136. The opening 137 penetrates the first dielectric layer 131 and the second dielectric layer 133, and the opening 137 is fully filled with the third dielectric layer 135. The conductive connection layer 138 covers an inner wall of the opening 137 and is connected to the second circuit layer 132, the third circuit layer 134, and the second conductive layer 136. Here, a dielectric constant (Dk) of the first dielectric layer 131, for example, ranges from 2.4 to 4.0, and a dielectric dissipation factor (DO of the first dielectric layer 131 is, for example, less than 0.02. A dielectric constant (Dk) of the second dielectric layer 133, for example, ranges from 2.0 to 3.5, and a dielectric dissipation factor (DO of the second dielectric layer 133 is, for example, less than 0.008. A dielectric constant (Dk) of the third dielectric layer 135, for example, ranges from 2.1 to 5.0, and a dielectric dissipation factor (DO of the third dielectric layer 135 is, for example, less than 0.025.

Furthermore, providing the third substrate 130 includes first providing the first dielectric layer 131 and two conductive layers disposed at two opposite sides of the first dielectric layer 131. The two conductive layers completely cover the two opposite sides of the first dielectric layer 131. Next, a patterning process is performed on the two conductive layers to form the second circuit layer 132 and the third circuit layer 134. Next, the second dielectric layer 133 and the second conductive layer 136 disposed on the second dielectric layer 133 are provided. The second dielectric layer 133 is press-fitted on the third circuit layer 134 so that the second dielectric layer 133 is located between the third circuit layer 134 and the second conductive layer 136. The second conductive layer 136 is not patterned, and the second conductive layer 136 completely covers a side of the second dielectric layer 133 relatively away from the first dielectric layer 131. Next, the opening 137 is formed to penetrate the second circuit layer 132, the first dielectric layer 131, the third circuit layer 134, the second dielectric layer 133, and the second conductive layer 136. The conductive connection layer 138 is formed at the inner wall of the opening 137 and is electrically connected to the second circuit layer 132, the third circuit layer 134, and the second conductive layer 136. Lastly, a plugging process is performed to fill the third dielectric layer 135 in the opening 137. The opening 137 is fully filled with the third dielectric layer 135, and the manufacture of the third substrate 130 is completed.

Figure 1B:
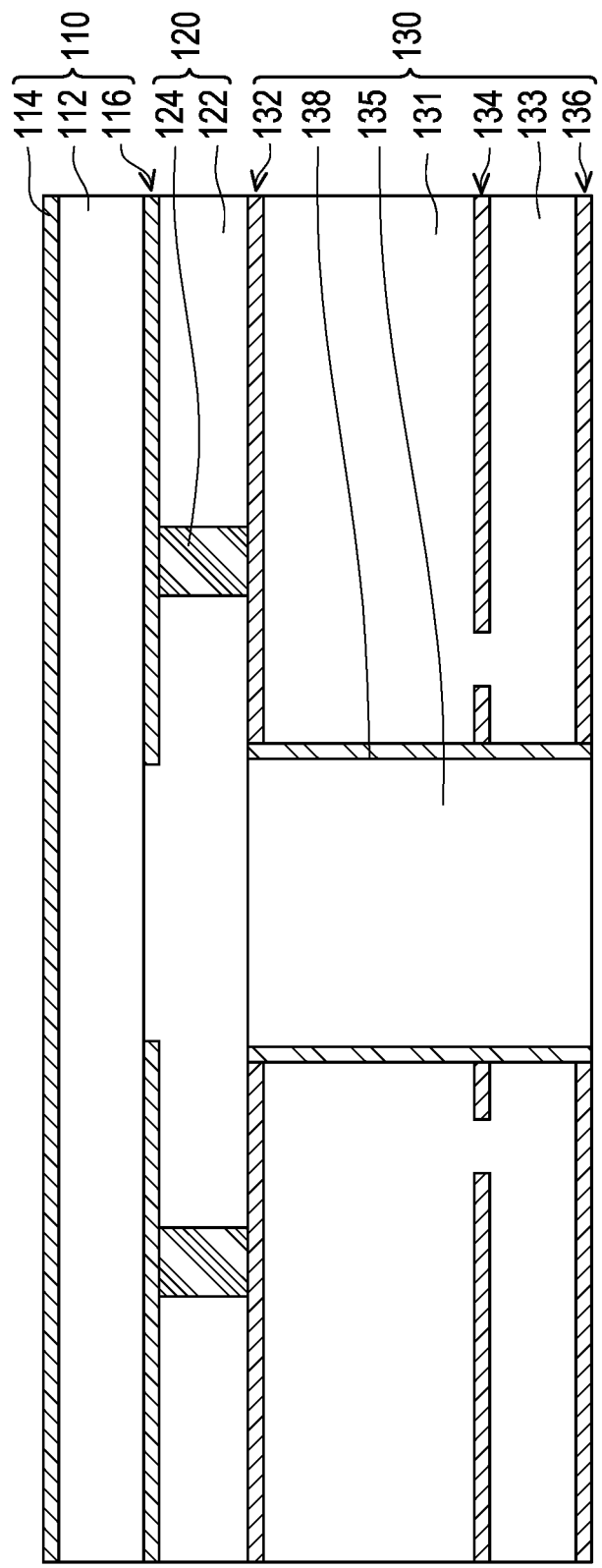

Next, referring to FIG. 1B, the first substrate 110, the second substrate 120, and the third substrate 130 are press-fitted so that the second substrate 120 is located between the first substrate 110 and the third substrate 130. Here, since a thermal compressing process is adopted, the base 122 of the second substrate 120 may be converted from the B phase state into a C phase state, which is the state of being completely cured. Hence, the first substrate 110 and the third substrate 130 are connected and fixed on the second substrate 120. The conductive pillars 124 of the second substrate 120 are deformed due to abutting against the first circuit layer 116 and the second circuit layer 132, and the conductive pillars 124 are electrically connected to the first circuit layer 116 of the first substrate 110 and the second circuit layer 132 of the third substrate 130.

Figure 1C:
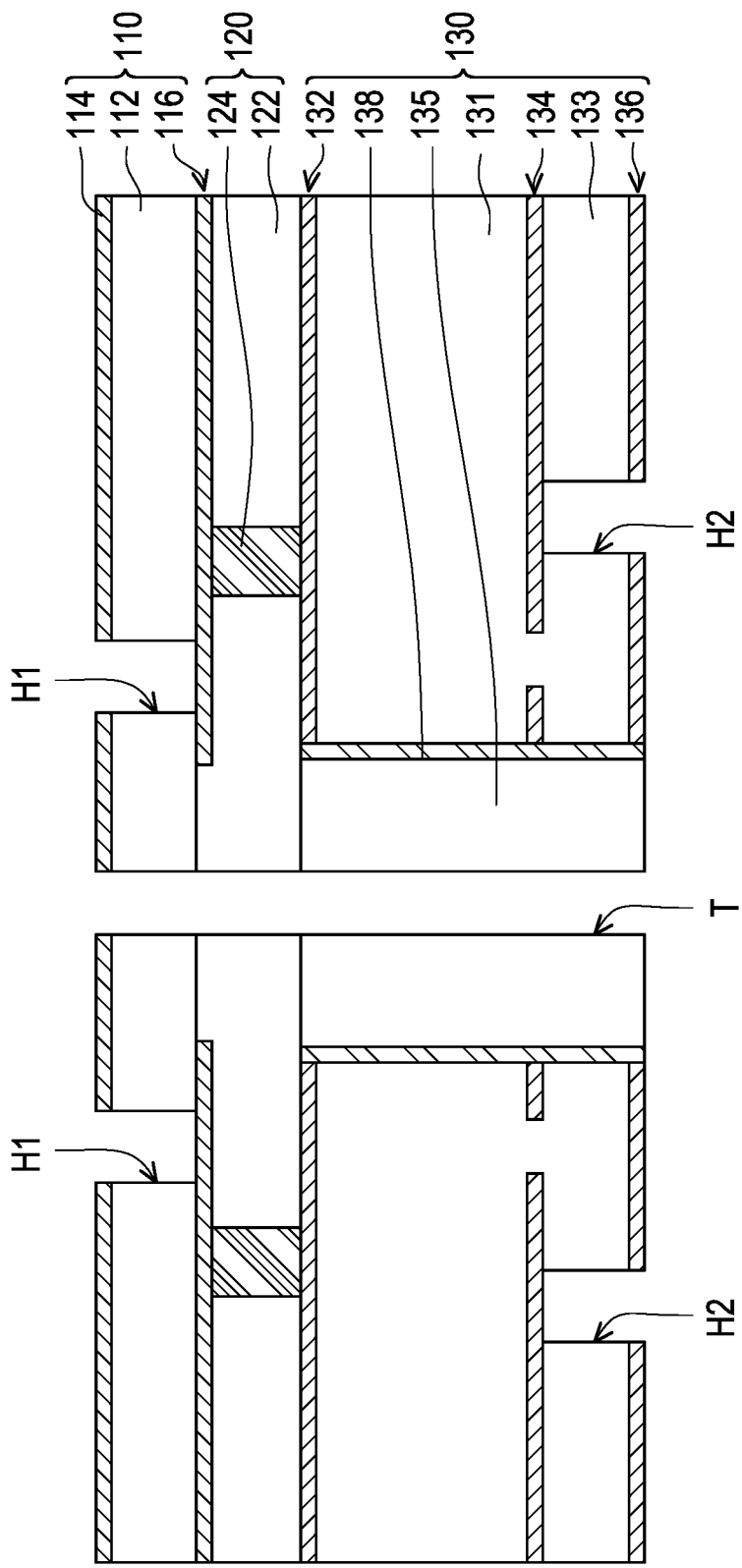

Next, referring to FIG. 1C, multiple first blind vias H1, multiple second blind vias H2, and a via T are formed. The first blind vias H1 extend from the first conductive layer 114 to the first circuit layer 116, and the second blind vias H2 extend from the second conductive layer 136 to the third circuit layer 134. The via T penetrates the first conductive layer 114 and the core layer 112 of the first substrate 110, the base 122 of the second substrate 120, and the third dielectric layer 135 of the third substrate 130. Here, a method for forming the first blind vias H1 and the second blind vias H2 is, for example, laser drilling, and a method for forming the via T is, for example, mechanical drilling; however, the disclosure is not limited thereto.

Figure 1D:
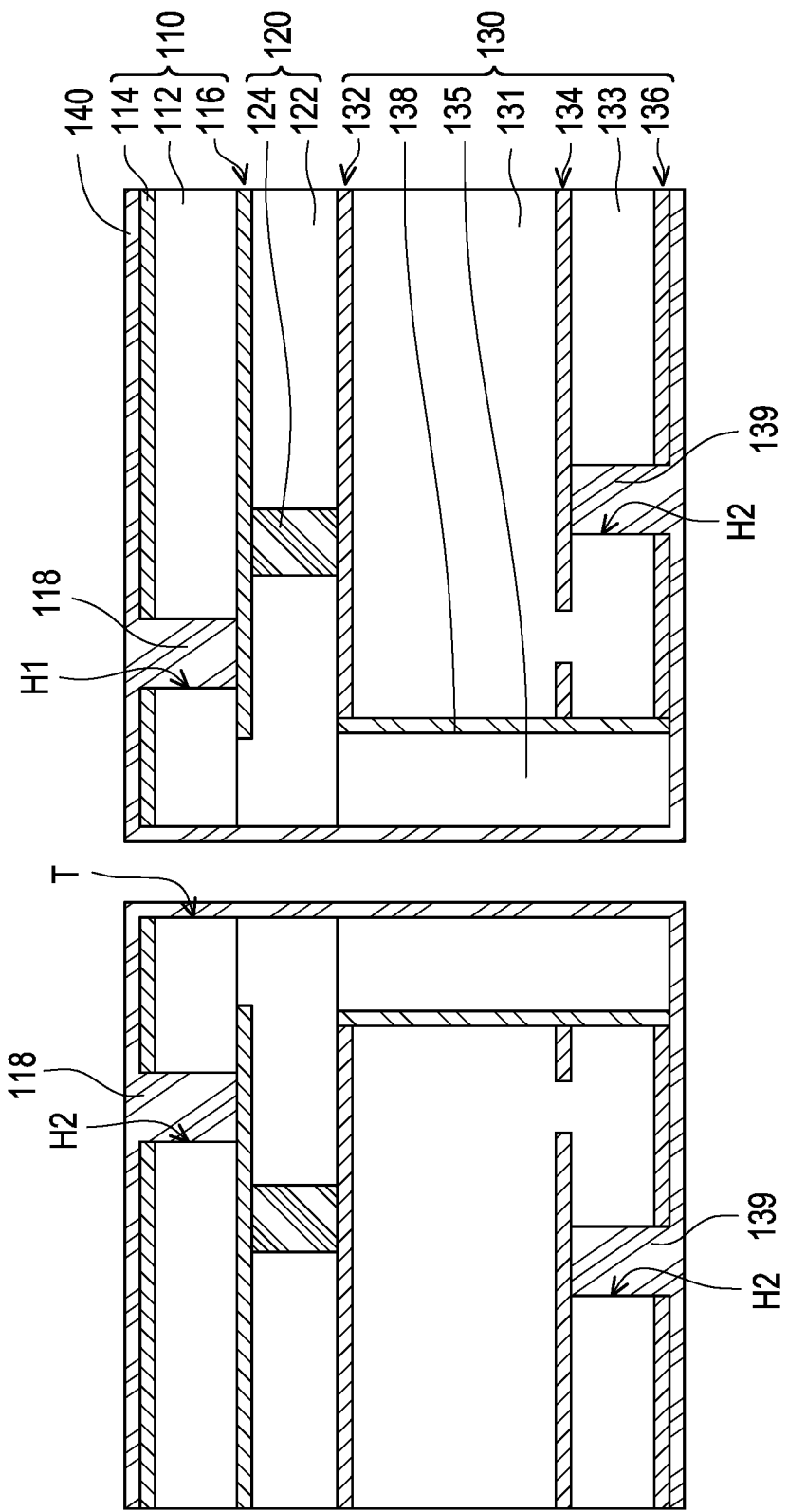

Next, referring to FIG. 1D, a conductive material layer 140 is formed to fully fill the first blind vias H1 and the second blind vias H2 and extend to cover the first conductive layer 114, the second conductive layer 136, and an inner wall of the via T. The conductive material layer 140 fully filling the first blind vias H1 defines multiple first conductive vias 118 of conductive structures. The conductive material layer 140 fully filling the second blind vias H2 defines multiple second conductive vias 139 of the conductive structures. Here, a method for forming the conductive material layer 140 is, for example, electroless plating or electrolytic plating process, and the conductive material layer 140 is, for example, copper; however, the disclosure is not limited thereto.

Figure 1E:
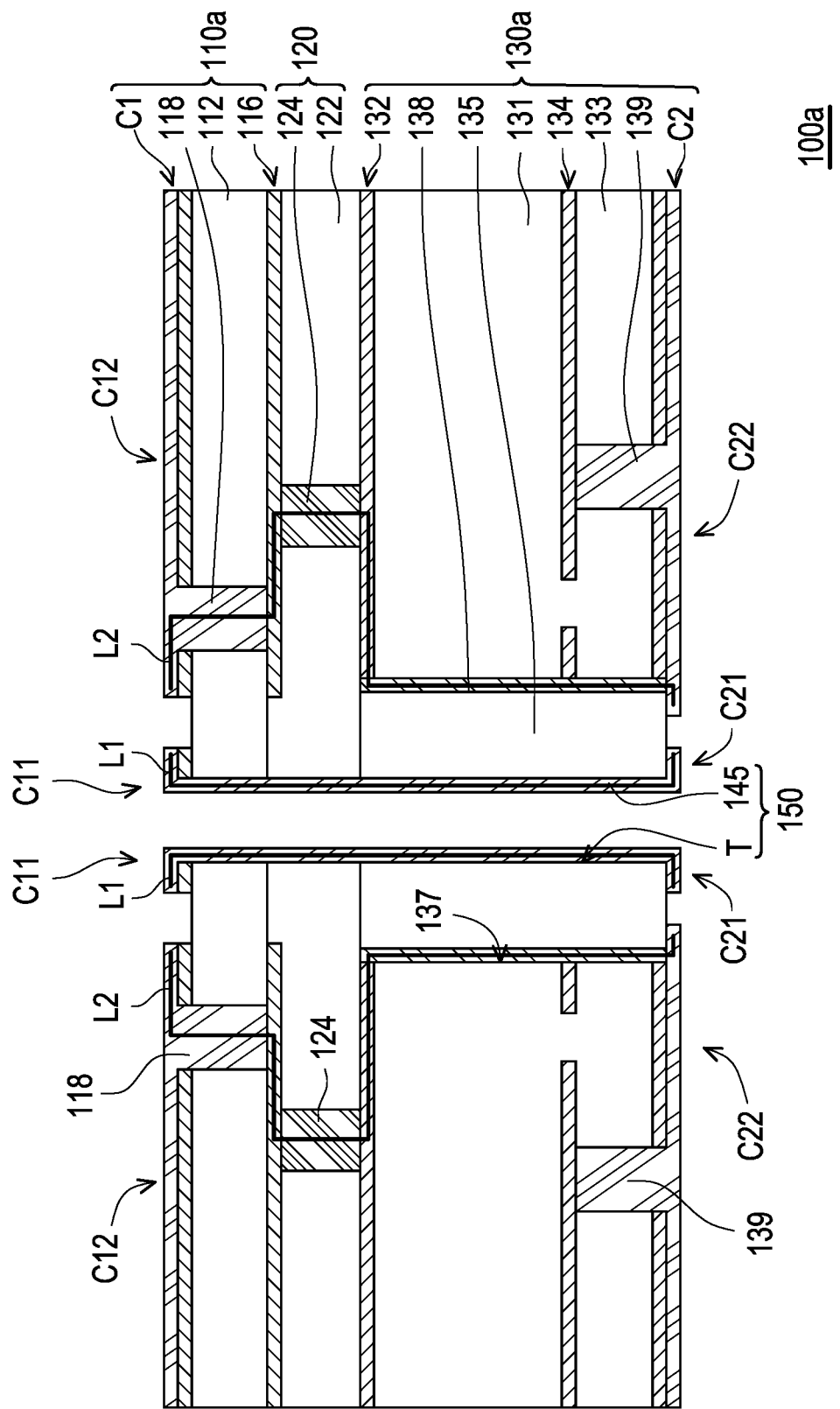
Figure 1F:
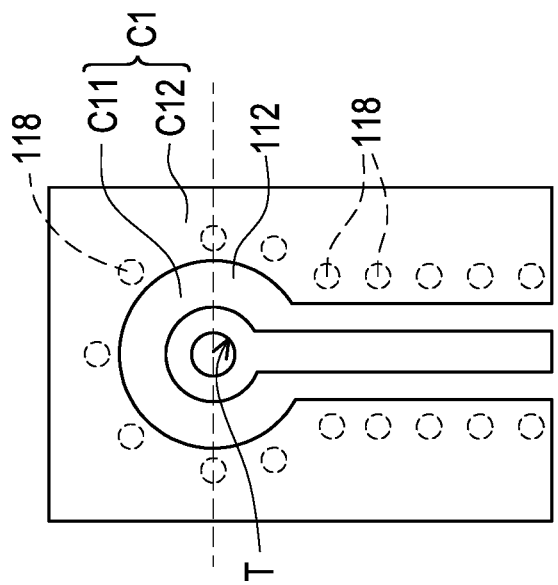
FIG. 1F is a top-view of a circuit board of FIG. 1E.

Lastly, referring to FIG. 1D and FIG. 1E together, the conductive material layer 140, the first conductive layer 114, and the second conductive layer 136 are patterned through a photolithography process to form a first external circuit layer C1, a second external circuit layer C2, and a conductive material 145 covering the inner wall of the via T and electrically connected to the first external circuit layer C1 and the second external circuit layer C2. The first external circuit layer C1 is located on the core layer 112 of the first substrate 110. The second external circuit layer C2 is located on the second dielectric layer 133 of the third substrate 130. The via T and the conductive material 145 define a conductive via structure 150.

Here, the conductive structures are formed (i.e. the first conductive vias 118, the conductive pillars 124, and the conductive connection layer 138) so that the first substrate 110, the second substrate 120, and the third substrate 130 are electrically connected through the conductive structures to define a ground path L2. The conductive via structure 150 is formed to penetrate the first substrate 110, the second substrate 120, and the third dielectric layer 135 of the third substrate 130. The conductive via structure 150 is electrically connected to the first substrate 110 and the third substrate 130 to define a signal path L1, and the ground path L2 surrounds the signal path L1. Furthermore, the first external circuit layer C1 includes a first signal circuit C11 and a first ground circuit C12. The second external circuit layer C2 includes a second signal circuit C21 and a second ground circuit C22. The first signal circuit C11, the conductive material 145, and the second signal circuit C21 define the signal path L1. The first ground circuit C12, the first conductive vias 118, the first circuit layer 116, the conductive pillars 124, the second circuit layer 132, the conductive connection layer 138, and the second ground circuit C22 define the ground path L2. The manufacture of a circuit board 100a is completed.

With respect to a structure, referring to FIG. 1E and FIG. 1F together, the circuit board 100a includes a first substrate 110a, the second substrate 120, a third substrate 130a, the conductive structures, and the conductive via structure 150. The second substrate 120 is disposed between the first substrate 110a and the third substrate 130a. The third substrate 130a has the opening 137 and includes the first dielectric layer 131, the second dielectric layer 133, and the third dielectric layer 135. The opening 137 penetrates the first dielectric layer 131 and the second dielectric layer 133, and the opening 137 is fully filled with the third dielectric layer 135. The conductive via structure 150 penetrates the first substrate 110a, the second substrate 120, and the third dielectric layer 135 of the third substrate 130a and is electrically connected to the first substrate 110a and the third substrate 130a to define the signal path L1. The first substrate 110a, the second substrate 120, and the third substrate 130a are electrically connected through the conductive structures to define the ground path L2. The ground path L2 surrounds the signal path L1.

Specifically, in the embodiment, the conductive structures include the first conductive vias 118, the conductive pillars 124, and the conductive connection layer 138. The first substrate 110a includes the core layer 112, the first external circuit layer C1, the first circuit layer 116, and the first conductive vias 118. The first external circuit layer C1 and the first circuit layer 116 are respectively disposed on the two opposite sides of the core layer 112. The first conductive vias 118 penetrate the core layer 112 and are electrically connected to the first external circuit layer C1 and the first circuit layer 116. The second substrate 120 includes the base 122 and the conductive pillars 124 penetrating the base 122. The third substrate 130a further includes the second circuit layer 132, the third circuit layer 134, the second external circuit layer C2, the second conductive vias 139, and the conductive connection layer 138. The second circuit layer 132 and the third circuit layer 134 are located at the two opposite sides of the first dielectric layer 131, and the second dielectric layer 133 covers the third circuit layer 134 and is located between the third circuit layer 134 and the second external circuit layer C2. The second conductive vias 139 penetrate the second dielectric layer 133 and are electrically connected to the second external circuit layer C2 and the third circuit layer 134. The conductive connection layer 138 covers the inner wall of the opening 137 and is connected to the second circuit layer 132, the third circuit layer 134, and the second external circuit layer C2. The conductive via structure 150 includes the via T and the conductive material 145. The via T penetrates the core layer 112 of the first substrate 110a, the base 122 of the second substrate 120, and the third dielectric layer 135 of the third substrate 130a. The conductive material 145 covers the inner wall of the via T and is electrically connected to the first external circuit layer C1 and the second external circuit layer C2.

Here, the first external circuit layer C1 includes the first signal circuit C11 and the first ground circuit C12. The second external circuit layer C2 includes the second signal circuit C21 and the second ground circuit C22. The first signal circuit C11, the conductive material 145, and the second signal circuit C21 define the signal path L1. The first ground circuit C12, the first conductive vias 118, the first circuit layer 116, the conductive pillars 124, the second circuit layer 132, the conductive connection layer 138, and the second ground circuit C22 define the ground path L2. Since the signal path L1 is surrounded by the ground path L2 in a closed manner, a favorable high-frequency and high speed circuit may be formed. In addition, by providing the first conductive vias 118, the conductive pillars 124, and the conductive connection layer 138, a gap of a shield may be filled to form a complete shield, which means a closed shielding surface is formed without an electromagnetic interference (EMI) gap region. As a result, signal energy loss and noise interference may be effectively reduced, and reliability of the signal transmission and high-frequency signal integrity may be increased. In addition, the first signal circuit C11 and the first ground circuit C12 of the first external circuit layer C1 are on the same plane, thereby exhibiting coplanarity and favorable flatness. As a result, in a further packaging process, an element (e.g. a chip) may not be damaged so that a product yield and structural reliability may be increased.

In summary, in the embodiment, the signal path L1 defined by the first signal circuit C11, the conductive material 145, and the second signal circuit C21 is surrounded by the ground path L2 defined by the first ground circuit C12, the first conductive vias 118, the first circuit layer 116, the conductive pillars 124, the second circuit layer 132, the conductive connection layer 138, and the second ground circuit C22. That is, the ground path L2 with favorable closure is provided around the signal path L1 capable of transmitting the high-frequency and high speed signal such as the 5G signal so that the favorable high-frequency and high speed circuit may be formed and the circuit board 100a of the embodiment may exhibit favorable signal integrity. Here, the high-frequency refers to a frequency greater than 1 GHz, and the high speed refers to a data transmission speed greater than 100 Mbps. It is generally known that data transmission speed and quality are important to a high-frequency circuit, and the main factors affecting the data transmission speed and quality are electrical properties of a transmission material, that is, a dielectric constant (Dk) and a dielectric dissipation factor (DO of the material. By reducing a dielectric constant and a dielectric dissipation factor of a substrate, signal propagation delay time may be effectively reduced. Moreover, a signal transmission speed may be increased, and signal transmission loss may be reduced.

In addition, the second substrate 120 provided in the embodiment is a circuit board final product, and the first substrate 110 and the third substrate 130 are circuit board semi-final products. The first substrate 110, the second substrate 120, the third substrate 130 are integrated by press-fitting. Therefore, compared to the conventional technology in which an inner conductor layer and an outer conductor layer of a coaxial via are blocked through a build up process of press-fitting an insulating layer, the manufacturing method of the circuit board 100a of the embodiment may prevent high-frequency signal integrity from being affected by impedance mismatch. In addition, the manufacturing process thereof is simplified and the cost is reduced. Furthermore, the first conductive vias 118, the conductive pillars 124, and the second conductive vias 139 of the embodiment are not located on the same axis, thereby enhancing reliability of thermal stress of stacked vias.

It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

Figure 2A:
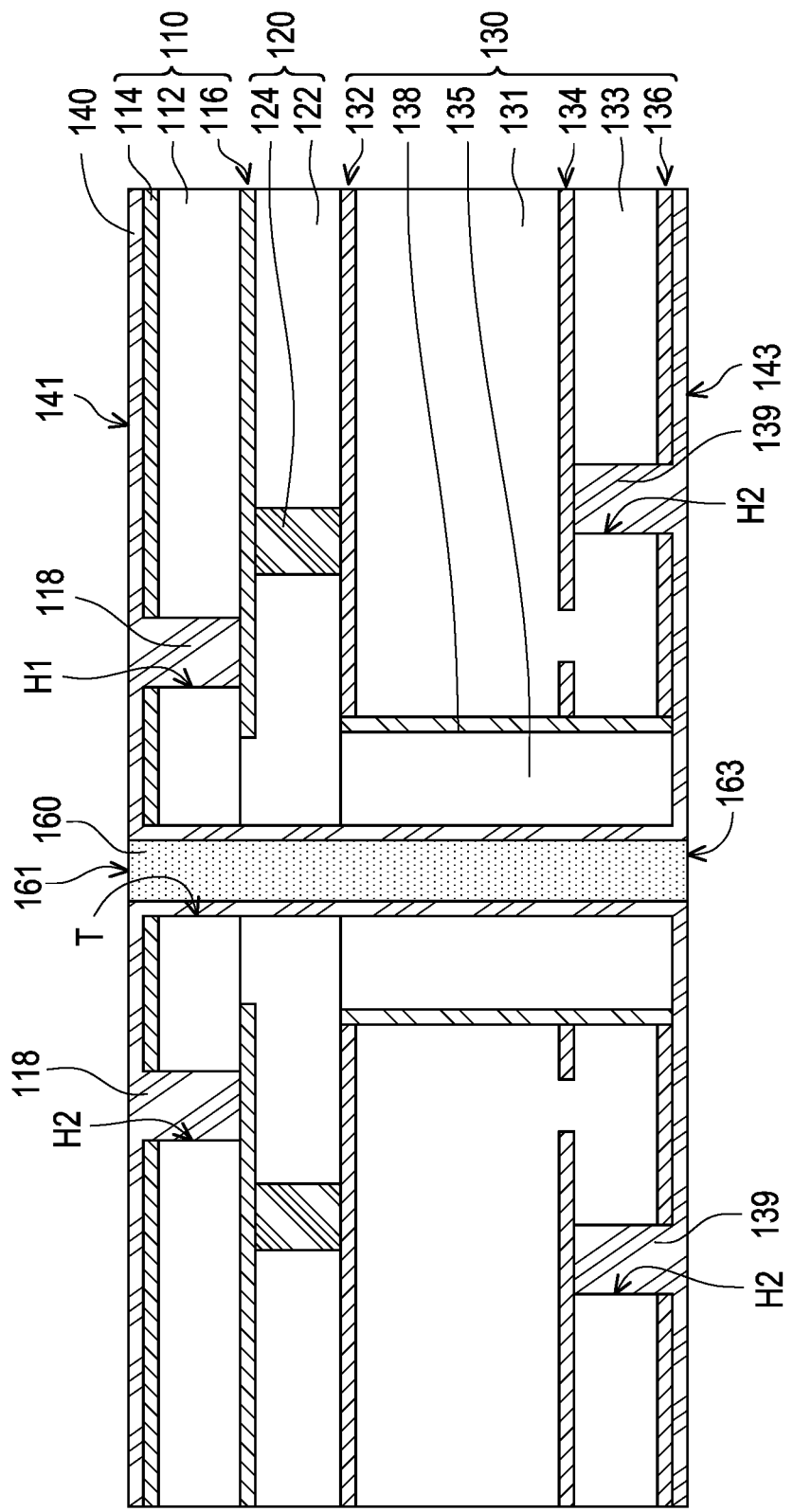
FIG. 2A to FIG. 2B are schematic cross-sectional diagrams of some steps of another manufacturing method of a circuit board according to another embodiment of the disclosure.
Figure 2B:
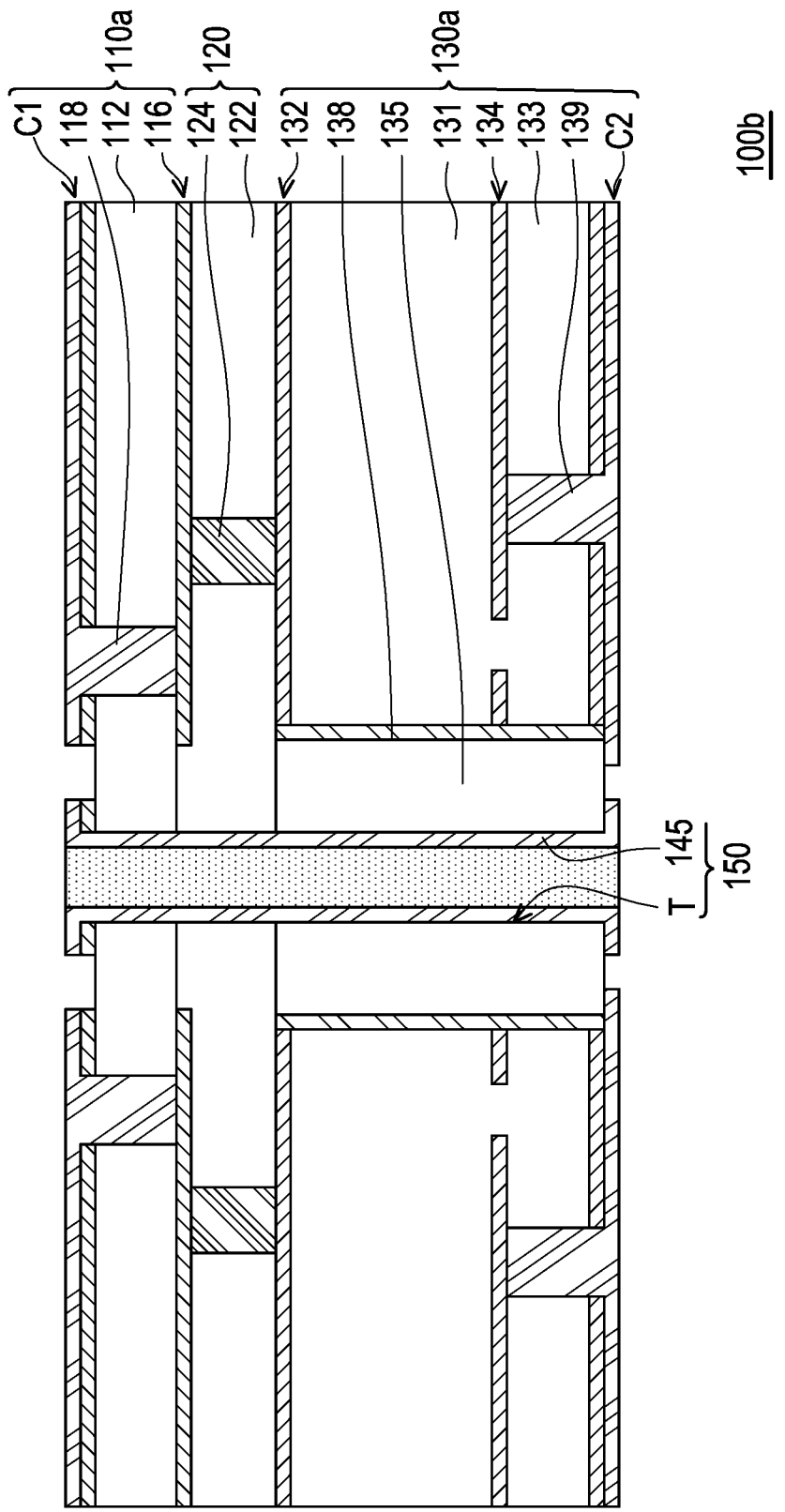

FIG. 2A to FIG. 2B are schematic cross-sectional diagrams of some steps of another manufacturing method of a circuit board according to another embodiment of the disclosure. Referring to FIG. 1D and FIG. 2A, a manufacturing method of a circuit board 100b in the embodiment is similar to the manufacturing method of the circuit board 100a above, and the difference lies in the following. After forming the conductive material layer 140 as shown in FIG. 1D, a fourth dielectric layer 160 is filled in the via T. The via T is fully filled with the fourth dielectric layer 160, and a first surface 161 and a second surface 163 of the fourth dielectric layer 160 that are opposite to each other are respectively flush with an upper surface 141 and a lower surface 143 of the conductive material layer 140. Here, a dielectric constant (Dk) of the fourth dielectric layer 160, for example, ranges from 2.0 to 4.8, and a dielectric dissipation factor (DO of the fourth dielectric layer 160 is, for example, less than 0.021.

Next, referring to FIG. 2A and FIG. 2B together, the conductive material layer 140, the first conductive layer 114, and the second conductive layer 136 are patterned through the photolithography process to form the first external circuit layer C1, the second external circuit layer C2, and the conductive material 145 covering the inner wall of the via T and electrically connected to the first external circuit layer C1 and the second external circuit layer C2. The first external circuit layer C1 is located on the core layer 112 of the first substrate 110. The second external circuit layer C2 is located on the second dielectric layer 133 of the third substrate 130. The via T and the conductive material 145 define the conductive via structure 150. The manufacture of the circuit board 100b is completed.

Figure 3A:
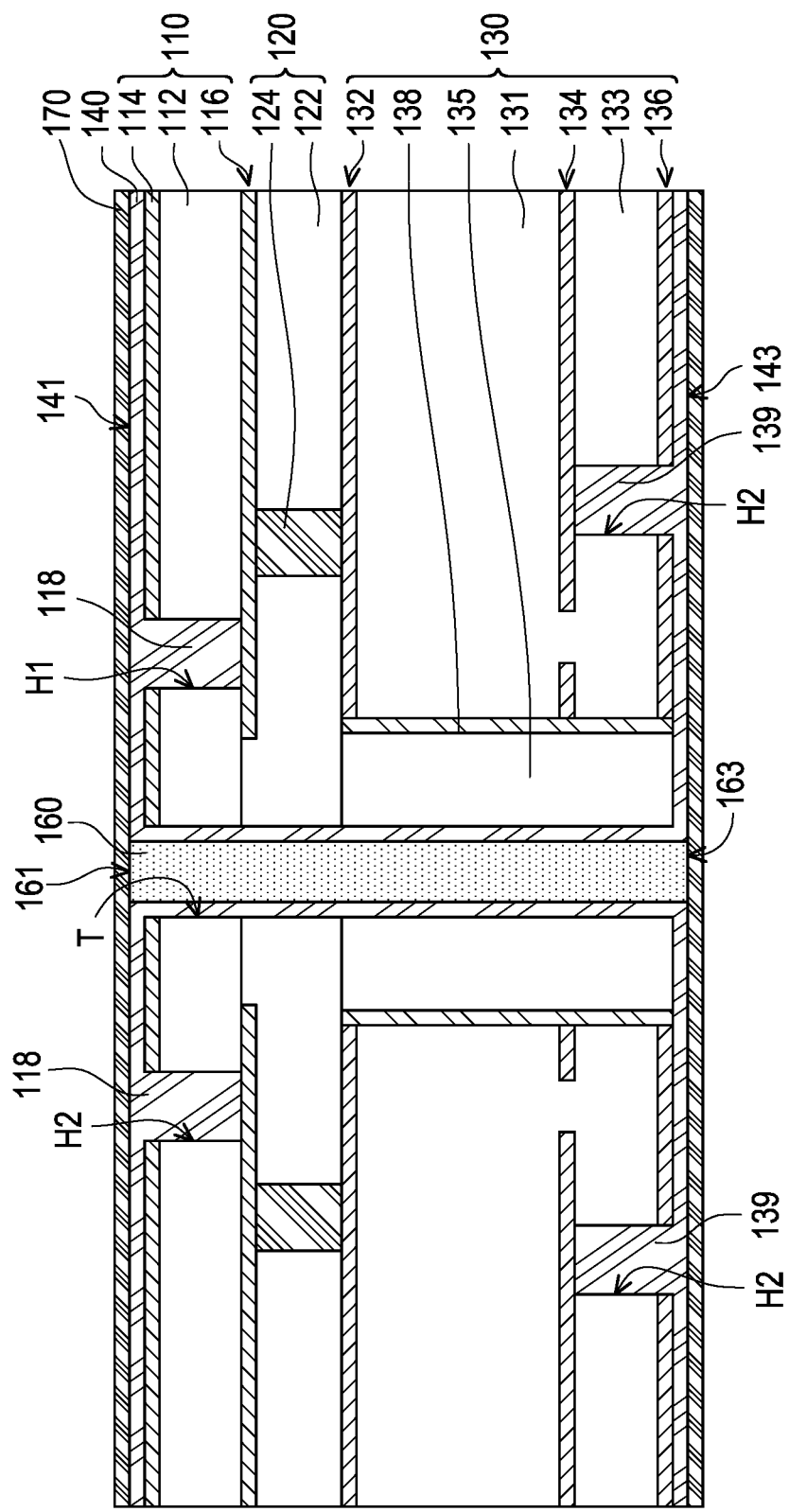
FIG. 3A to FIG. 3B are schematic cross-sectional diagrams of some steps of another manufacturing method of a circuit board according to another embodiment of the disclosure.
Figure 3B:
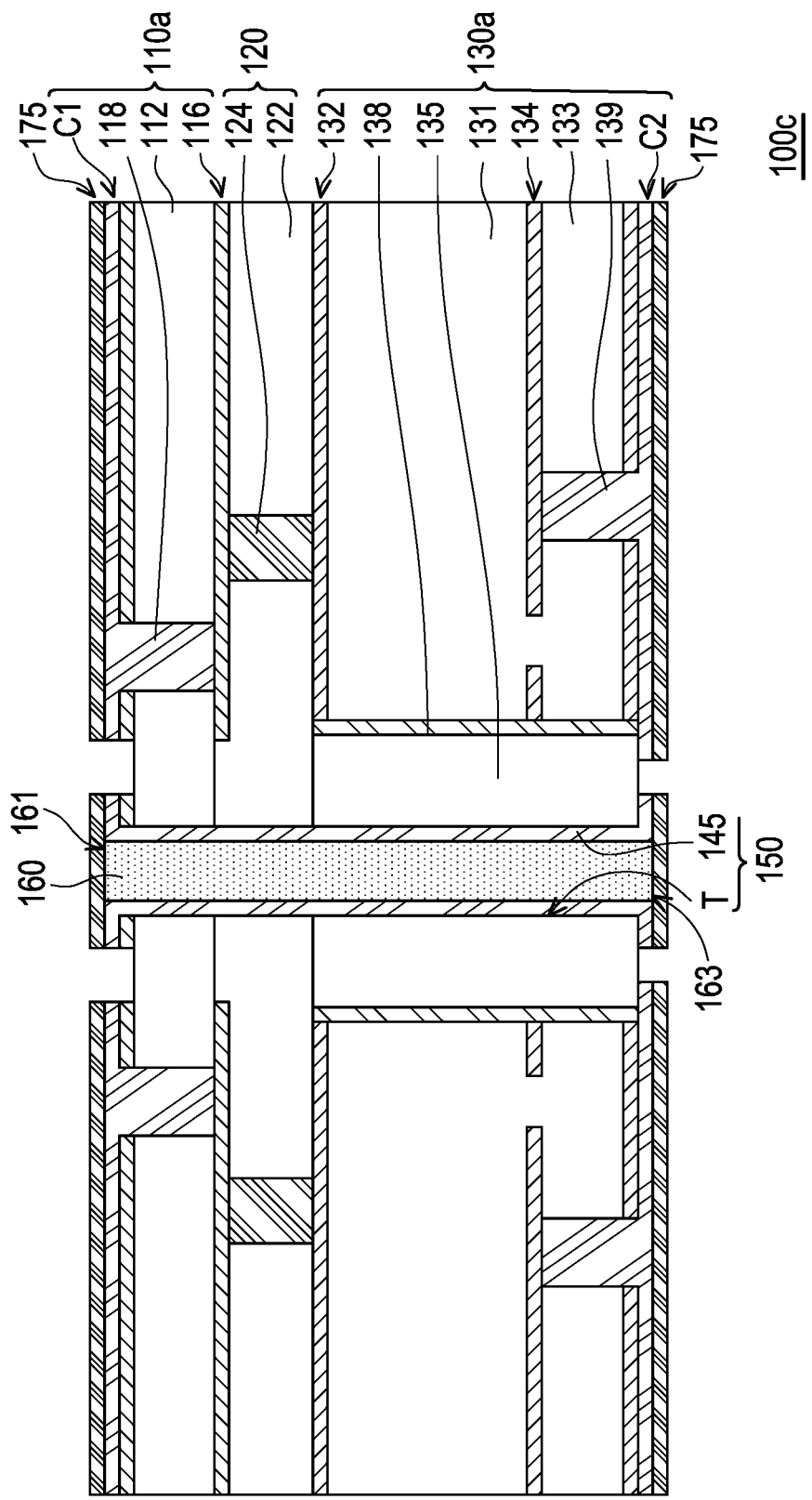

FIG. 3A to FIG. 3B are schematic cross-sectional diagrams of some steps of another manufacturing method of a circuit board according to another embodiment of the disclosure. Referring to FIG. 2A and FIG. 3A, a manufacturing method of a circuit board 100c in the embodiment is similar to the manufacturing method of the circuit board 100b above, and the difference lies in the following. After filling the fourth dielectric layer 160 in the via T as shown in FIG. 2A, referring to FIG. 3A, a metal layer 170 is formed on the conductive material layer 140. The metal layer 170 covers the upper surface 141 and the lower surface 143 of the conductive material layer 140 and the first surface 161 and the second surface 163 of the fourth dielectric layer 160. Here, a method for forming the metal layer 170 is, for example, electroless plating or electrolytic plating process, and the metal layer 170 is, for example, copper; however, the disclosure is not limited thereto.

Next, referring to FIG. 3A and FIG. 3B together, the metal layer 170, the conductive material layer 140, the first conductive layer 114, and the second conductive layer 136 are patterned through the photolithography process to form the first external circuit layer C1, the second external circuit layer C2, the conductive material 145 covering the inner wall of the via T and electrically connected to the first external circuit layer C1 and the second external circuit layer C2, and a capping layer 175. The first external circuit layer C1 is located on the core layer 112 of the first substrate 110. The second external circuit layer C2 is located on the second dielectric layer 133 of the third substrate 130. The via T and the conductive material 145 define the conductive via structure 150. The capping layer 175 covers the first external circuit layer C1, the second external circuit layer C2, and the first surface 161 and the second surface 163 of the fourth dielectric layer 160. The manufacture of the circuit board 100c is completed.

Figure 4:
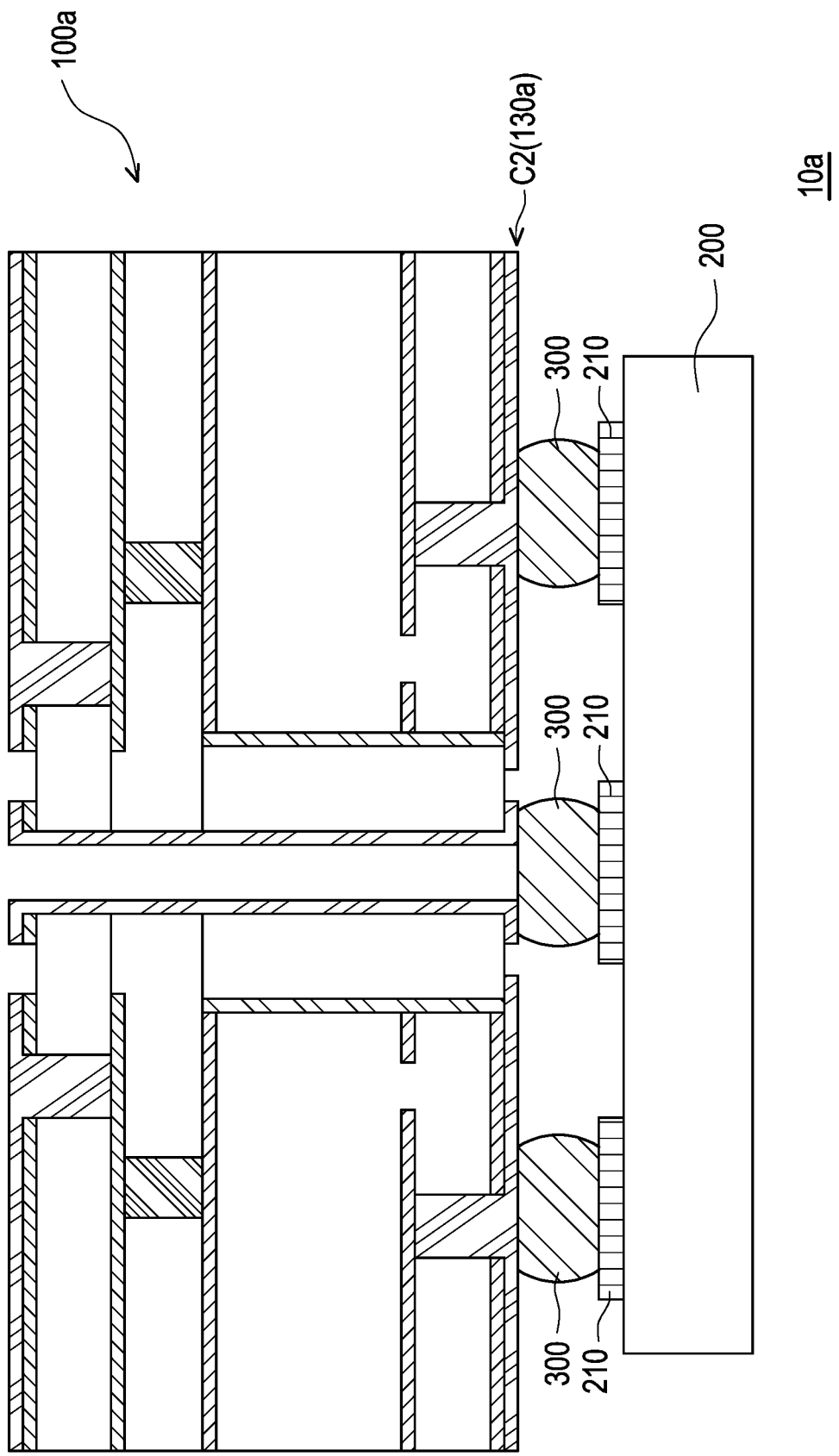
FIG. 4 is a schematic cross-sectional diagram of an electronic device according to an embodiment of the disclosure.

FIG. 4 is a schematic cross-sectional diagram of an electronic device according to an embodiment of the disclosure. Referring to FIG. 4, in the embodiment, an electronic device 10a includes, for example, the circuit board 100a of FIG. 1E and an electronic device 200. The electronic device 200 is electrically connected to the circuit board 100a. The electronic device 200 includes multiple pads 210. In addition, the electronic device 10a of the embodiment further includes multiple connection members 300 disposed between the second external circuit layer C2 of the third substrate 130a of the circuit board 100a and the electronic device 200. The electronic device 200 is electrically connected to the circuit board 100*a* through the connection members 300. The connection members 300 are, for example, solder balls; however, the disclosure is not limited thereto. In application, an antenna structure may be provided at another side of the circuit board 100*a* opposite to the electronic device 200, and the antenna structure and the circuit board 100*a* are electrically connected. In application of integrated circuits and antennas, in the circuit board 100*a* of the embodiment, signal interference on the same plane may be eliminated. Signal energy loss and noise interference may be reduced to enhance the reliability of signal transmission.

Figure 5:
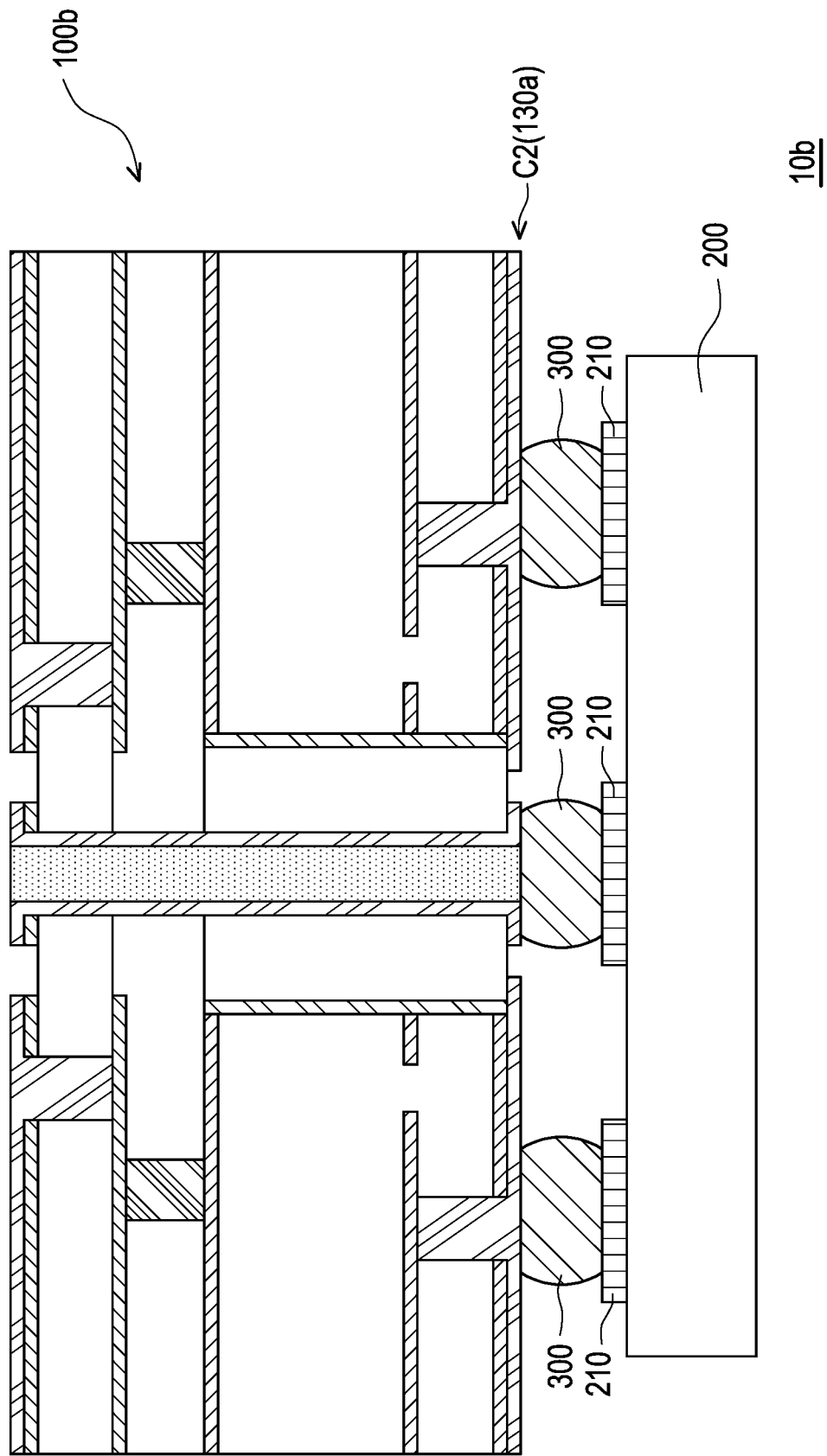
FIG. 5 is a schematic cross-sectional diagram of an electronic device according to another embodiment of the disclosure.

FIG. 5 is a schematic cross-sectional diagram of an electronic device according to another embodiment of the disclosure. Referring to FIG. 5, in the embodiment, an electronic device 10*b* includes, for example, the circuit board 100*b* of FIG. 2B and the electronic device 200. The electronic device 200 is electrically connected to the circuit board 100*b*. The electronic device 200 includes the multiple pads 210. In addition, the electronic device 10*b* of the embodiment further includes the multiple connection members 300 disposed between the second external circuit layer C2 of the third substrate 130*a* of the circuit board 100*b* and the electronic device 200. The electronic device 200 is electrically connected to the circuit board 100*b* through the connection members 300. The connection members 300 are, for example, the solder balls; however, the disclosure is not limited thereto. In application, an antenna structure may be provided at another side of the circuit board 100*b* opposite to the electronic device 200, and the antenna structure and the circuit board 100*b* are electrically connected. In application of integrated circuits and antennas, in the circuit board 100*b* of the embodiment, signal interference on the same plane may be eliminated. Signal energy loss and noise interference may be reduced to enhance the reliability of signal transmission.

Figure 6:
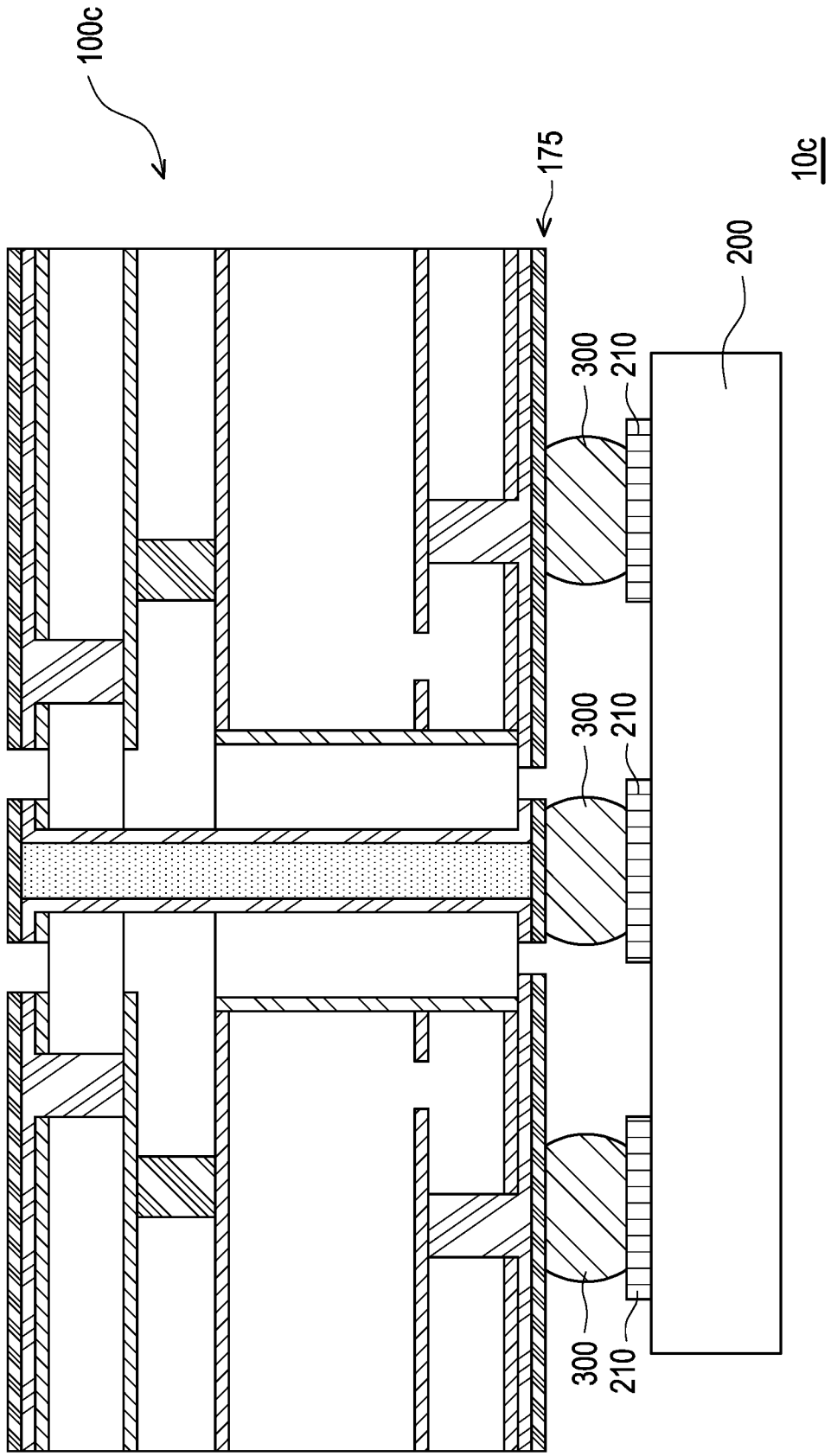
FIG. 6 is a schematic cross-sectional diagram of an electronic device according to another embodiment of the disclosure.

FIG. 6 is a schematic cross-sectional diagram of an electronic device according to another embodiment of the disclosure. Referring to FIG. 6, in the embodiment, an electronic device 10*c* includes, for example, the circuit board 100*c* of FIG. 3B and the electronic device 200. The electronic device 200 is electrically connected to the circuit board 100*c*. The electronic device 200 includes the multiple pads 210. In addition, the electronic device 10*c* of the embodiment further includes the multiple connection members 300 disposed between the capping layer 175 of the circuit board 100*c* and the electronic device 200. The electronic device 200 is electrically connected to the circuit board 100*c* through the connection members 300. The connection members 300 are, for example, the solder balls; however, the disclosure is not limited thereto. In application, an antenna structure may be provided at another side of the circuit board 100*c* opposite to the electronic device 200, and the antenna structure and the circuit board 100*c* are electrically connected. In application of integrated circuits and antennas, in the circuit board 100*c* of the embodiment, signal interference on the same plane may be eliminated. Signal energy loss and noise interference may be reduced to enhance the reliability of signal transmission.

In summary of the above, in the design of the circuit board of the disclosure, the conductive via structure penetrates the first substrate, the second substrate, and the third dielectric layer of the third substrate and is electrically connected to the first substrate and the third substrate to define the signal path. The first substrate, the second substrate, and the third substrate are electrically connected through the conductive structures to define the ground path. The ground path surrounds the signal path. Hence, the favorable high-frequency and high speed signal circuit may be formed, and in further application of integrated circuits and antennas, signal interference on the same plane may be eliminated. Signal energy loss and noise interference may be reduced to enhance the reliability of signal transmission.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A circuit board comprising a first substrate, a second substrate, a third substrate, a plurality of conductive structures, a conductive via structure, a fourth dielectric layer and a capping layer, wherein
the first substrate comprises a first external circuit layer;
the second substrate is disposed between the first substrate and the third substrate;
the third substrate has an opening and comprises a second external circuit layer, a first dielectric layer, a second dielectric layer, and a third dielectric layer, the opening penetrates the first dielectric layer and the second dielectric layer, and the opening is fully filled with the third dielectric layer;
the conductive via structure comprises a via penetrating the first substrate, the second substrate, and the third dielectric layer of the third substrate and the conductive via structure is electrically connected to the first substrate and the third substrate to define a signal path;
the first substrate, the second substrate, and the third substrate are electrically connected through the conductive structures to define a ground path, wherein the ground path surrounds the signal path;
the fourth dielectric layer fully fills the via, wherein a first surface and a second surface of the fourth dielectric layer that are opposite to each other are respectively flush with an upper surface of the first external circuit layer and a lower surface of the second external circuit layer; and
the capping layer is disposed on the upper surface of the first external circuit layer, the lower surface of the second external circuit layer, and the first surface and the second surface of the fourth dielectric layer.

2. The circuit board according to claim 1, wherein the conductive structures comprise a plurality of first conductive vias, a plurality of conductive pillars, and a conductive connection layer;
the first substrate further comprises a core layer, a first circuit layer, and the first conductive vias, the first external circuit layer and the first circuit layer are respectively disposed on two opposite sides of the core layer, and the first conductive vias penetrate the core layer and are electrically connected to the first external circuit layer and the first circuit layer;
the second substrate comprises a base and the plurality of conductive pillars penetrating the base; and
the third substrate further comprises a second circuit layer, a third circuit layer, a plurality of second conductive vias, and the conductive connection layer, the second circuit layer and the third circuit layer are located at two opposite sides of the first dielectric layer, the second dielectric layer covers the third circuit layer and is located between the third circuit layer and the second external circuit layer, the second conductive vias penetrate the second dielectric layer and are electrically connected to the second external circuit layer and the third circuit layer, and the conductive connection layer covers an inner wall of the opening and is connected to the second circuit layer, the third circuit layer, and the second external circuit layer; and the conductive via structure further comprises a conductive material, the via penetrates the core layer of the first substrate, the base of the second substrate, and the third dielectric layer of the third substrate, and the conductive material covers an inner wall of the via and is electrically connected to the first external circuit layer and the second external circuit layer.

3. The circuit board according to claim 2, wherein the first external circuit layer comprises a first signal circuit and a first ground circuit, the second external circuit layer comprises a second signal circuit and a second ground circuit, the first signal circuit, the conductive material, and the second signal circuit define the signal path, and the first ground circuit, the first conductive vias, the first circuit layer, the conductive pillars, the second circuit layer, the conductive connection layer, and the second ground circuit define the ground path.

4. An electronic device, comprising:
a circuit board comprising a first substrate, a second substrate, a third substrate, a plurality of conductive structures, a conductive via structure, a fourth dielectric layer and a capping layer, wherein
the first substrate comprises a first external circuit layer;
the second substrate is disposed between the first substrate and the third substrate;
the third substrate has an opening and comprises a second external circuit layer, a first dielectric layer, a second dielectric layer, and a third dielectric layer, the opening penetrates the first dielectric layer and the second dielectric layer, and the opening is fully filled with the third dielectric layer;
the conductive via structure comprises a via penetrating the first substrate, the second substrate, and the third dielectric layer of the third substrate and the conductive via structure is electrically connected to the first substrate and the third substrate to define a signal path;
the first substrate, the second substrate, and the third substrate are electrically connected through the conductive structures to define a ground path, wherein the ground path surrounds the signal path;
the fourth dielectric layer fully fills the via, wherein a first surface and a second surface of the fourth dielectric layer that are opposite to each other are respectively flush with an upper surface of the first external circuit layer and a lower surface of the second external circuit layer; and
the capping layer is disposed on the upper surface of the first external circuit layer, the lower surface of the second external circuit layer, and the first surface and the second surface of the fourth dielectric layer; and
an electronic element electrically connected to the circuit board.

5. The electronic device according to claim 4, further comprising:
a plurality of connection members disposed between the third substrate of the circuit board and the electronic element, wherein the electronic element is electrically connected to the circuit board through the connection members.

\* \* \* \* \*